July 29, 1969 L. B. ROBINSON 3,458,732

LATCHING TYPE SWITCHING CIRCUIT

Filed March 15, 1967

INVENTOR.
LESLIE B. ROBINSON

BY Bruce C Lutz

ATTORNEY

United States Patent Office 3,458,732
Patented July 29, 1969

3,458,732
LATCHING TYPE SWITCHING CIRCUIT
Leslie B. Robinson, Edmonds, Wash., assignor to Honeywell Inc., Minneapolis, Minn., a corporation of Delaware
Filed Mar. 15, 1967, Ser. No. 623,368
Int. Cl. H03k 3/26
U.S. Cl. 307—273 5 Claims

ABSTRACT OF THE DISCLOSURE

A latching type switching circuit which provides an output pulse in response to an input pulse. The output pulse is independent in length of the input pulse and is dependent only upon the RC time constant of the circuit.

BACKGROUND OF THE INVENTION AND DESCRIPTION

This application pertains generally to electronic circuitry and more specifically to an electronic circuit which is usable for producing output pulses of a predetermined length or time period in response to an input pulse.

While the prior art has produced many one shot circuits which this is essentially a species of, none of these circuits have the inherent simplicity of construction or design that the present circuit has.

It is therefore an object of this invention to provide an improved pulse converting circuit.

Further objects and advantages of this invention may be ascertained from a reading of the specification and appended claims in conjunction wtih the drawings wherein:

Figure 1:
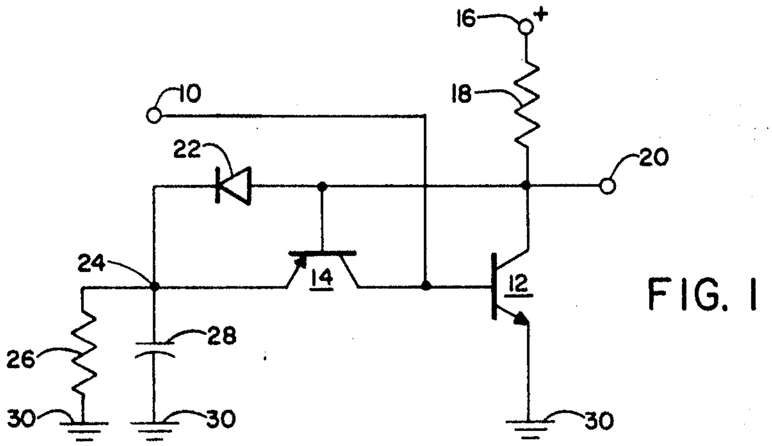
FIGURE 1 is a circuit diagram of the basic embodiment of the circuit.

In FIGURE 1 an input terminal 10 is connected to a base or input means of an NPN transistor or switch means generally designated as 12 and to a collector or output means of PNP transistor or switch means generally designated as 14. A positive power terminal 16 is shown connected through a resistor 18 to an output terminal 20, to a collector or output means of the transistor 12 and a base of the transistor 14. A diode 22 is connected between output terminal 20 and a junction point 24. A resistor 26 and a capacitor 28 are connected in parallel between junction point 24 and ground or reference potential 30. Junction point 24 is also connected to an emitter or further output means of transistor 14. An emitter or further output means of transistor 12 is also connected to ground 30.

Figure 2:
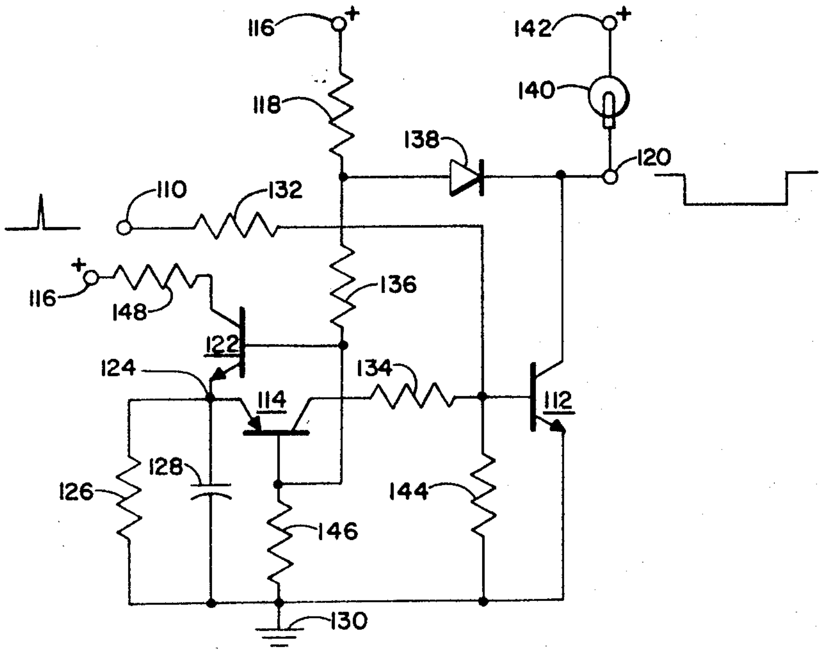
FIGURE 2 is a specific circuit diagram of one working embodiment wherein the operation of a light is controlled.

In FIGURE 2 the same elements as shown in FIGURE 1 are given the same designation with 100 added to the designation. In other words, the input terminal is designated as 110 rather than 10. It will be noted that there is added a resistor 132 between input 110 and the base of transistor 112. Also a resistor 134 is connected between the base of transistor 112 and the collector of transistor 114. A resistor 136 is also added between the resistor 118 and the junction point which in FIGURE 1 is common to diode 22 and the base of transistor 14. Further, a diode 138 is added between the collector of transistor 112 and the common junction point between resistors 118 and 136. Further, a lamp or other load to be energized 140 is between a positive power source 142 and output 120. Power terminal 142 may be the same as power source 116. A resistance element 144 is connected between the base of transistor 112 and ground 130 and a resistance element 146 is connected between the base of transistor 114 and ground 130. Finally, a transistor 122 is used to replace diode 22 with the collector connected through a resistor 148 to power terminal 116, an emitter connected to junction point 124 and a base connected to the base of transistor 114.

OPERATION

In the quiescent state a current will flow through resistor 18 of FIGURE 1, and diode 22 to charge capacitor 28 to essentially the positive supply voltage. Current flow through diode 22 will back bias transistor 14 and therefore prevent current flow to energize transistor 14 and therefore transistor 12. When capacitor 28 is fully charged, current will still flow in minimal amounts through diode 22 to ground 30 through resistor 26. Thus, transistor 14 will still be back biased. As will be realized, some transistors do not need this additional protection of resistor 26 to keep them in an OFF condition. An input pulse is then received at input 10 which will energize transistor 12. The lowering of the collector potential of transistor 12 will lower the base of transistor 14 below the emitter potential. Thus, current will flow from capacitor 28 through the emitter-collector junction of transistor 14 and into the base-emitter junction of transistor 12. Thus a feedback action will occur to keep the output at the collector of transistor 12 and the output terminal 20 at an essentially ground potential until capacitor 28 is discharged. The circuit as shown in FIGURE 1 will work but will have no positive control of the output pulse width. To gain control of the pulse width the resistor 134 from FIGURE 2 should be inserted along with resistor 136. The resistor 134 will provide a more constant resistance portion of the RC time constant and if the pulse width is to be essentially proportional to the RC time constant, resistor 136 must be much larger than the resistance of element 134. If resistor 136 is not added along with resistor 134, capacitor 128 can discharge directly through the emitter base of transistor 114 and then through the collector emitter of transistor 112 so as to shorten the discharge time period.

Referring now to FIGURE 2, this circuit is designed to provide a low impedance path to ground for the load 140. When transistor 112 is in the off condition it is desirable to have diode 138 to prevent the load 140 from turning on either during the initial charging of capacitor 128 or for a condition wherein the potential of supply 142 is higher than that of 116. Further, resistor 144 provides more positive control of the turn on and turn off characteristics of transistor 112. Resistor 146 may be used to form a voltage divider in conjunction with resistors 136 and 118 to alter the charge potential on capacitor 128 thus providing a further means of controlling pulse width. A transistor 122 is shown replacing the diode 22 of FIGURE 1. While a diode could be used in this circuit as well as in FIGURE 1, the transistor 122 is provided to illustrate an improvement whereby a fast recovery time between pulses is allowed by providing the low impedance resistor 148 through which capacitor 128 recharges rapidly. While the power terminal to which resistor 148 is connected is shown as terminal 116, it could be any other power source of any potential suitable for this circuit.

While only the basic embodiment and one working embodiment of the invention have been shown, it is to be realized that other embodiments will be readily apparent to those skilled in the art. These embodiments would, of course, include other types of switching devices other than the transistors shown and other semiconductor polarity types. These different polarity types may, of course, be accompanied by changes in polarity of potentials supplied to the circuit and other minor changes. Therefore, I wish to be limited only by the scope of the appended claims.

I claim:

1. Pulse stretching apparatus comprising, in combination:

first switch means including first and second output means and input means, said switch means connecting said input means to said first output means in response to a short duration activating input signal pulse applied thereto;

reference potential means connected to said first output means;

means for supplying said short duration activating input signal pulse to said first switch means;

power supply terminal means;

energy storage means connected between said terminal means and said reference potential means;

second switch means including a first output means connected to said energy storage means and including a second output means connected to said input means of said first switch means for providing a current path therebetween in response to the activating input signal pulse, the connection of said second switch means to said input means of said first switch means includes a timing first impedance means, the current thereby provided from said energy storage means maintaining said first switch means in an activated condition;

apparatus output means; and means connecting said second output means of said first switch means to said apparatus output means and to said second switch means, the means connecting said second output means of said first switch means to said second switch means includes a second impedance means of a large value relative to said timing impedance means, whereby said second switch means is activated for a substantially longer time period than the duration of the pulse applied to said first switch means.

2. Apparatus as claimed in claim 1 wherein:

the timing first impedance means is connected to an output means of said second switch means; and the second impedance means is connected to an input means of said second switch means.

3. Switching apparatus comprising, in combination:

first and second semiconductor switching means of opposite conductivity types, each including first, second and third electrode means;

apparatus output means connected to said first electrode means of said first semiconductor means;

reference potential means connected to said second electrode means of said first semiconductor means;

means connecting said first electrode means of said second semiconductor means to said third electrode means of said first semiconductor means;

energy storage means connected between said second electrode means of said second semiconductor means and said reference potential means;

unidirectional current control means connected between said second and third electrodes of said second semiconductor means;

power terminal means;

means connecting said power terminal means to said third electrode means of said second semiconductor means and to said first electrode means of said first semiconductor means; and means connected to said third electrode means of said first semiconductor means for supplying a pulse input thereto.

4. Apparatus as claimed in claim 3 wherein said first, second and third electrode means are respectively collector, emitter and base of both said first and second semiconductor switching means.

5. Apparatus as claimed in claim 4 wherein:

said unidirectional current control means is a third semiconductor means for normally biasing said second semiconductor switching means to an OFF condition;

said means connecting said first electrode means of said second semiconductor means to said third electrode means of said first semiconductor means is an impedance means for determining the time constant of the switching apparatus; and said means connecting said power terminal means to said third electrode means of said second semiconductor means is an impedance means for reducing discharge currents from said energy storage means through said first electrode means of said first semiconductor means.

References Cited

UNITED STATES PATENTS

| | | | |
|---|---|---|---|
| 2,770,732 | 11/1956 | Chong | 307—288 XR |
| 3,033,998 | 5/1962 | Nellis | 307—288 XR |
| 3,193,701 | 7/1965 | Lawhon | 307—288 XR |
| 3,215,852 | 11/1965 | Brode et al. | 307—288 XR |
| 3,244,906 | 4/1966 | Goering | 307—273 XR |

ARTHUR GAUSS, Primary Examiner

JOHN ZAZWORSKY, Assistant Examiner

US. Cl. X.R.

307—267, 288, 293; 328—58